(12) United States Patent
Lee

(10) Patent No.: US 9,620,711 B2
(45) Date of Patent: *Apr. 11, 2017

(54) ELECTRONIC DEVICE

(71) Applicant: SK hynix Inc., Icheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 55 days.

This patent is subject to a terminal disclaimer.

(21) Appl. No.: 14/737,337

(22) Filed: Jun. 11, 2015

(65) Prior Publication Data

US 2016/0248009 A1     Aug. 25, 2016

(30) Foreign Application Priority Data

Feb. 23, 2015 (KR) ........................ 10-2015-0024950

(51) Int. Cl.
   *H01L 45/00*     (2006.01)
   *H01L 27/24*     (2006.01)
   *G06F 3/06*     (2006.01)

(52) U.S. Cl.
CPC ........ *H01L 45/1253* (2013.01); *G06F 3/0604* (2013.01); *G06F 3/0659* (2013.01); *G06F 3/0673* (2013.01); *H01L 27/2409* (2013.01); *H01L 27/2427* (2013.01); *H01L 27/2463* (2013.01); *H01L 45/08* (2013.01); *H01L 45/1233* (2013.01); *H01L 45/146* (2013.01)

(58) Field of Classification Search
CPC .................. H01L 45/1233; H01L 45/1253
See application file for complete search history.

(56) References Cited

U.S. PATENT DOCUMENTS 7,400,006 B1    7/2008   Rinerson et al.
8,502,343 B1*   8/2013   Jha .......................... H01L 45/08
                                                                              257/536

(Continued)

FOREIGN PATENT DOCUMENTS

KR    10-2014-0081135 A    7/2014

OTHER PUBLICATIONS

Seonghyun Kim et al., "Ultrathin (<10nm) $NB_2O_2/NbO_2$ Hybrid Memory with Both Memory anhd Selector Characteristics for High Density 3D Vertically Stackable RRAM Applications,"Symposium on VLSI Technology Digest of Technical Papers, 2012, pp. 155-156, IEEE.

(Continued)

*Primary Examiner* — Allison P Bernstein

(57) ABSTRACT

An electronic device includes a semiconductor unit. The semiconductor unit includes a first electrode and a second electrode spaced apart from each other in a first direction; and a first material layer interposed between the first electrode and the second electrode and having a variable resistance characteristic or a threshold switching characteristic, wherein the first electrode, or the second electrode, or both includes a plurality of sub-electrodes and a plurality of second material layers that are alternately arranged in the first direction, and wherein each of the second material layers has a thickness that is sufficiently small to enable the second material layers to exhibit an ohmic-like behavior for a current flowing therein at an operating current of the semiconductor unit.

20 Claims, 12 Drawing Sheets

(56) References Cited

U.S. PATENT DOCUMENTS

2015/0207071 A1* 7/2015 Ode .................. H01L 27/2409
257/4
2016/0247858 A1 8/2016 Kim et al.

OTHER PUBLICATIONS

Akifumi Kawahara et al., "An 8Mb Multi-Layered Cross-Point ReRAM Macro with 443MB/s Write Throughput," International Solid-State Circuits Conference, Feb. 22, 2012, pp. 432-434, Session 25/ Non-Volatile Memory Solutions/ 25.6, ISSCC.
Myoung-Jae Lee et al., "Highly-Scalable Threshold Switching Select Device based on Chaclogenide Glasses for 3D Nanoscaled Memory Arrays," IEDM12-33, 2012, pp. 2.6.1-2.6.3, IEEE.

* cited by examiner

ELECTRONIC DEVICE

CROSS-REFERENCE TO RELATED APPLICATION

The present application claims priority to Korean Patent Application No. 10-2015-0024950, entitled "ELECTRONIC DEVICE" and filed on Feb. 23, 2015, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can include a semiconductor unit having improved operating characteristic and reliability.

In an embodiment, an electronic device includes a semiconductor unit that comprises a first electrode and a second electrode spaced apart from each other in a first direction; and a first material layer interposed between the first electrode and the second electrode and having a variable resistance characteristic or a threshold switching characteristic, wherein the first electrode, or the second electrode, or both includes a plurality of sub-electrodes and a plurality of second material layers that are alternately arranged in the first direction, and wherein each of the second material layers has a thickness that is sufficiently small to enable the second material layers to exhibit an ohmic-like behavior for a current flowing therein at an operating current of the semiconductor unit.

Embodiments of the above device may include one or more of the following.

Each of the plurality of second material layers is not broken down at the operating current. Each of the plurality of second material layers includes an insulating material or a semiconductor material. The plurality of second material layers has substantially the same thicknesses. The plurality of second material layers includes substantially the same materials. When the first electrode includes the plurality of sub-electrodes and the plurality of second material layers, two sub-electrodes of the plurality of sub electrodes are positioned at both ends of the first electrode in the first direction, respectively. The first material layer has a resistance value that changes according to whether a conductive path is generated or disappears in the first material layer. The first material layer has a single-layered structure or multi-layered structure including a metal oxide, a phase-change material, a ferroelectric material, a ferromagnetic material, or a combination thereof. The first material layer has a single-layered structure or multi-layered structure including a diode, an OTS (Ovonic Threshold Switching) material, an MIEC (Mixed Ionic Electronic Conducting) material, an MIT (Metal Insulator Transition) material, a tunneling insulating material, or a combination thereof. The first material layer includes a stack structure in which an oxygen-deficient metal oxide layer and an oxygen-rich metal oxide layer are arranged in the first direction. When the first electrode includes the plurality of sub-electrodes and the plurality of second material layers, the oxygen-rich metal oxide layer is adjacent to the first electrode. The first material layer includes a plurality of layers which are arranged in the first direction, and wherein at least one of the plurality of layers is a tunneling insulating layer. When the first electrode includes the plurality of sub-electrodes and the plurality of second material layers, the tunneling insulating layer is adjacent to the first electrode.

In another embodiment, an electronic device includes a semiconductor memory unit having a plurality of memory cells, each of the plurality of memory cells comprises a first electrode and a second electrode spaced apart from each other in a first direction; a variable resistance element interposed between the first electrode and the second electrode; and a threshold switching element interposed between the variable resistance element and the second electrode, wherein the first electrode, or the second electrode, or both includes a plurality of sub-electrodes and a plurality of material layers that are alternately arranged in the first direction, and wherein each of the material layers has a thickness that is sufficiently small to enable the material layers to exhibit an ohmic-like behavior for a current flowing therein at an operating current of the memory cell.

Embodiments of the above device may include one or more of the following.

Each of the plurality of memory cells further comprises: a third electrode interposed between the variable resistance element and the threshold switching element. The third electrode includes the plurality of sub-electrodes and the plurality of material layers that are alternately arranged in the first direction. Each of the plurality of material layers includes an insulating material or a semiconductor material. The semiconductor memory unit further comprises: first lines extending in a second direction crossing the first direction; and second lines extending in a third direction crossing the first and second directions, wherein the first lines are spaced apart from the second lines in the first direction, and wherein the plurality of memory cells are located at intersections of the first lines and the second lines, respectively.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor unit is a part of the memory or the buffer memory in the memory system.

These and other aspects, implementations and associated advantages are described will become apparent in view of the drawings and the description of embodiments provided herein, which are intended to provide further explanation of the invention as claimed.

DETAILED DESCRIPTION

Figure 1A:
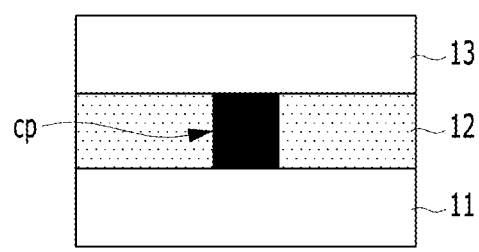
FIG. 1A is a cross-sectional view illustrating a semiconductor device in accordance with a comparative example.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

Prior to describing implementations, a semiconductor device in accordance with a comparative example, an operating method thereof, and a problem thereof will be described.

Figure 1B:
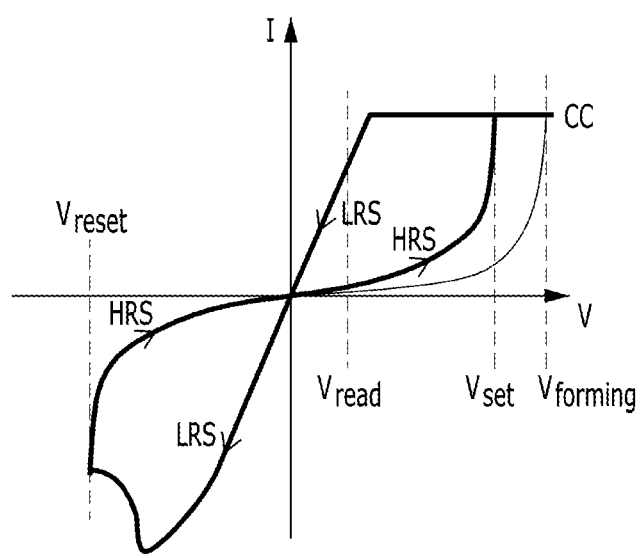
FIG. 1B is a graph for explaining an operating method in a case that the semiconductor device of FIG. 1A includes a variable resistance element.
Figure 1C:
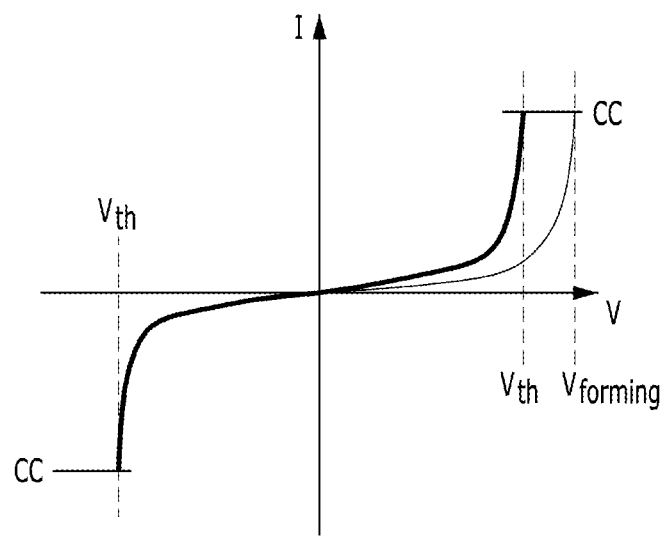
FIG. 1C is a graph for explaining an operating method in a case that the semiconductor device of FIG. 1A includes a threshold switching element.
Figure 1D:
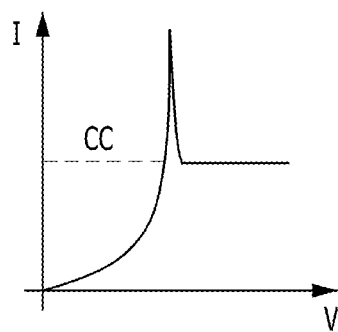
FIG. 1D is a graph for explaining a problem occurring in the semiconductor device of FIG. 1A.

FIG. 1A is a cross-sectional view illustrating a semiconductor device in accordance with a comparative example, FIG. 1B is a graph for explaining an operating method in a case that the semiconductor device of FIG. 1A includes a variable resistance element, FIG. 1C is a graph for explaining an operating method in a case that the semiconductor device of FIG. 1A includes a threshold switching element, and FIG. 1D is a graph for explaining a problem occurring in the semiconductor device of FIG. 1A.

Referring to FIG. 1A, the semiconductor device of the comparative example may include a first electrode 11, a second electrode 13 located over the first electrode 11 and spaced apart from the first electrode 11, and a material layer 12 interposed between the first electrode 11 and the second electrode 13.

The first electrode 11 and the second electrode 13 may serve as applying a voltage or current to both ends of the material layer 12, and be formed of a conductive material.

The material layer 12 may have a variable resistance characteristic which switches between different resistance states according to a voltage or current supplied thereto through the first electrode 11 and the second electrode 13. The material layer 12 having the variable resistance characteristic may be referred to as a variable resistance element. A current-voltage characteristic of the variable resistance element is exemplarily shown in FIG. 1B.

Referring to FIG. 1B, in an initial state, the variable resistance element may be in a high resistance state HRS. When a voltage applied to the variable resistance element reaches a certain positive voltage, a set operation may be performed so that the variable resistance element changes from the high resistance state HRS to a low resistance state LRS. The voltage applied to the variable resistance element during the set operation may be referred to as a set voltage Vset.

After the set operation is completed, the voltage applied to the variable resistance element decreases, and the low resistance state LRS of the variable resistance element may be maintained until the voltage reaches a certain negative voltage. When the voltage applied to the variable resistance element reaches the certain negative voltage, a reset operation may be performed so that the variable resistance element changes from the low resistance state LRS to the high resistance state HRS. The voltage applied to the variable resistance element during the reset operation may be referred to as a reset voltage Vreset.

In this manner, the variable resistance element may repeatedly switch between the low resistance state LRS and the high resistance state HRS.

Meanwhile, an initial set operation of a plurality of set operations may be referred to as a forming operation. A forming voltage applied to the variable resistance element during the forming operation may be higher than the set voltage Vset. This is because a voltage required to generate a conductive path in the material layer 12 for the first time is larger than a voltage performing set operations following the forming operation. The set voltage Vset may be substantially constant during set operations after the forming operation. Likewise, the reset voltage Vreset may be substantially constant during reset operations.

In any case, the variable resistance element may have one of the low resistance state LRS set by the set operation and the high resistance state HRS set by the reset operation, and maintain its previous resistance state until the reset voltage Vreset or the set voltage Vset is applied thereto. Therefore, the variable resistance element may serve as a non-volatile memory device which stores different data according to its resistance state and maintains stored data although power is off.

When a read operation is performed to read data stored in the variable resistance element, a read voltage Vread in a range between the set voltage Vset and the reset voltage Vreset may be applied to the variable resistance element. Since the resistance state of the variable resistance element may be determined by data that has been written in the variable resistance element in a previous write operation, different data may be read with the read voltage Vread according to whether the data stored in the variable resistance element corresponds to first data, e.g., set data, or second data, e.g., reset data if the variable resistance element stores 1-bit data.

Referring again to FIG. 1A, the material layer 12 of the variable resistance element may have a single-layered structure or multi-layered structure including one or more of various variable resistance materials that are used in an RRAM, a PRAM, an FRAM, an MRAM, etc. The variable resistance materials may include a metal oxide such as a transition metal oxide, a perovskite-based material, a phase-change material such as a chalcogenide-based material, a ferroelectric material, a ferromagnetic material, etc. Here, a resistance value of the material layer 12 may be changed according to whether a conductive path CP is generated or disappears in the material layer 12. That is, when the conductive path CP electrically connecting the first electrode 11 and the second electrode 13 is generated in the material layer 12, the material layer 12 may have a low resistance state. On the other hand, when the conductive path CP disappears, the material layer 12 may have a high resistance state. For example, the material layer 12 may include an oxygen-deficient metal oxide containing a large amount of oxygen vacancies. In this case, the conductive path CP may be formed by movement of the oxygen vacancies. However, in other examples, the conductive path CP may be formed by various manners according to a type of the material layer 12, a film structure, an operating characteristic, etc.

Alternatively, the material layer 12 may have a threshold switching characteristic which can block or hardly allow a current flow at a voltage smaller than a threshold voltage having a certain magnitude while allowing a rapid current flow at a voltage same as or larger than the threshold voltage. The material layer 12 having the threshold switching characteristic may be referred to as a threshold switching element. A current-voltage characteristic of the threshold switching element is exemplarily shown in FIG. 1C.

Referring to FIG. 1C, the threshold switching element may be in a high resistance state when a magnitude of a voltage applied thereto is smaller than that of a threshold voltage Vth. The high resistance state of the threshold switching element may be changed into a low resistance state when the voltage applied thereto reaches the threshold voltage Vth. That is, the threshold switching element may be in a turn-on state (low resistance state) or turn-off state (high resistance state), which is determined based on the threshold voltage Vth. A resistance value of the threshold switching element may be changed according to whether a conductive path is generated or disappears in the threshold switching element.

An operation in which the resistance state of the threshold switching element becomes the low resistance state for the first time may be referred to as a forming operation. A magnitude of a forming voltage Vforming applied to the threshold switching element during the forming operation may be larger than that of the threshold voltage Vth. This is because a voltage required to generate a conductive path for the first time is larger than a voltage performing operations following the forming operation. The threshold voltage Vth may be substantially constant during the following operations after the forming operation.

In any case, the threshold switching element may have a resistance change detected based on the threshold voltage Vth. The threshold switching element may be turned on or turned off according to whether a voltage applied thereto is greater or smaller than the threshold voltage Vth, respectively. Unlike the variable resistance element, the threshold switching element cannot maintain its resistance state when power is off, and cannot have two or more resistance states at a same voltage. The threshold switching element may be used as a selection element which is coupled to the above-described variable resistance element and controls an access to the variable resistance element. In this case, the variable resistance element and the threshold switching element coupled thereto may form a memory cell. Alternatively, the threshold switching element may be used for a volatile memory device.

Referring again to FIG. 1A, the material layer 12 of the threshold switching element may include one or more of a diode, an OTS (Ovonic Threshold Switching) material such as a chalcogenide-based material, an MIEC (Mixed Ionic Electronic Conducting) material such as a chalcogenide-based material containing a metal, an MIT (Metal Insulator Transition) material such as $NbO_2$ or $VO_2$, a tunneling insulating layer having a relatively wide band gap such as $SiO_2$ or $Al_2O_3$, etc. The material layer 12 of the threshold switching element may be turned on or turned off according to whether a conductive path CP is generated or disappears in the material layer 12. For example, when the material layer 12 includes a tunneling insulating layer which selectively allows tunneling of electrons, the conductive path CP may be formed by movement of the electrons. However, in other examples, the conductive path CP may be formed by various manners according to a type of the material layer 12, a film structure, an operating characteristic, etc.

However, in the above semiconductor device of the comparative example, an excessive overshooting current may occur during an operation in which the resistance state of the material layer 12 is changed into the low resistance state, for example, the forming operation and/or the set operation. FIG. 1D shows an overshooting current occurring in the forming operation. The overshooting current is much larger than a compliance current CC. For example, the overshooting current may be hundreds of times larger than the compliance current CC.

The overshooting current increases a size of the conductive path CP formed in the material layer 12. When the size of the conductive path CP is large, an off-current of the semiconductor device increases, thereby increasing a leakage current in the semiconductor device. In addition, when the off-current increases, a difference between the off-current and an on-current decreases. Therefore, when the material layer 12 shown in FIG. 1A is used for a memory cell, a data read margin may be reduced. As a result, an operating characteristic of the semiconductor device of FIG. 1A may be deteriorated.

In accordance with implementations of the present disclosure, a semiconductor device can generate a conductive path having a small size by controlling an overshooting current during operations, and as a result, reduce an off-current. Hereinafter, a semiconductor device according to an implementation will be described in more detail with reference to FIGS. 2A to 2D.

Figure 2A:
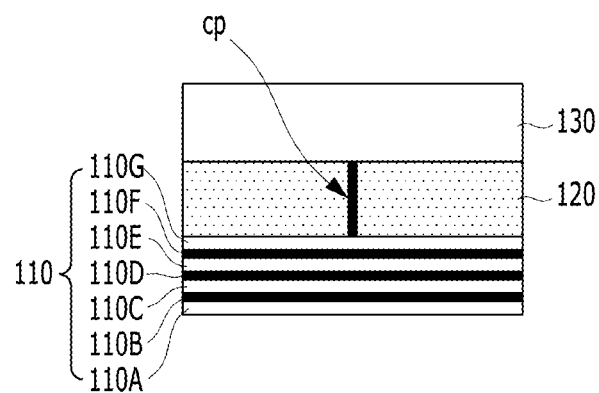
FIG. 2A is a cross-sectional view illustrating a semiconductor device in accordance with an implementation.
Figure 2B:
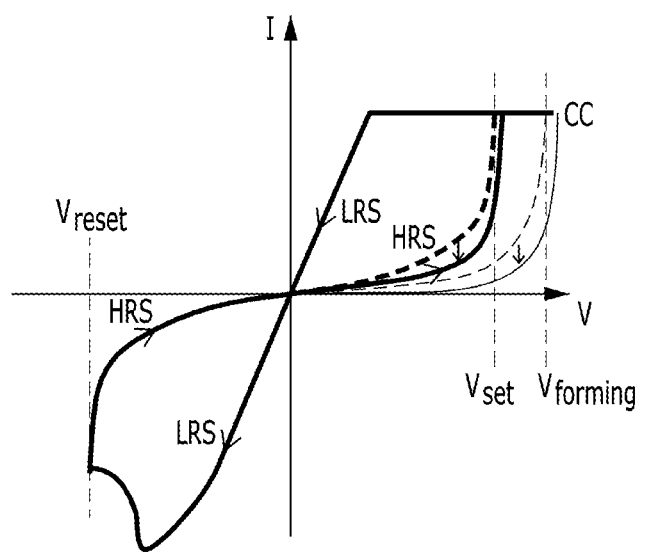
FIG. 2B is a graph for explaining an operating method in a case that the semiconductor device of FIG. 2A includes a variable resistance element.
Figure 2C:
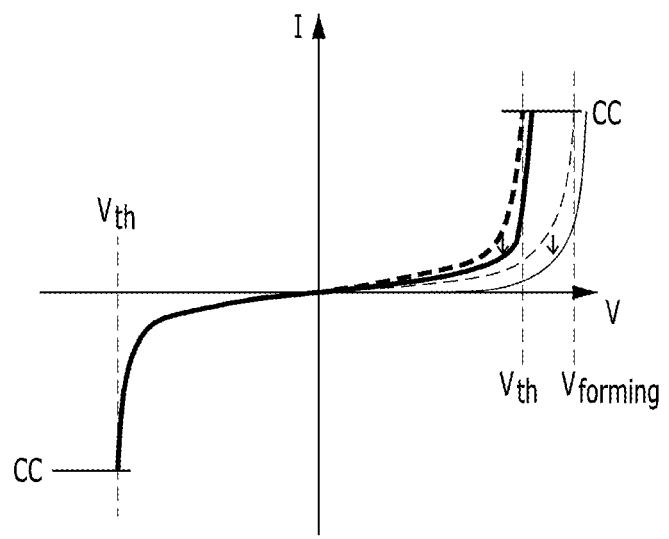
FIG. 2C is a graph for explaining an operating method in a case that the semiconductor device of FIG. 2A includes a threshold switching element.
Figure 2D:
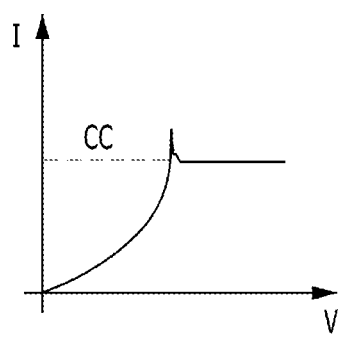
FIG. 2D is a graph showing a current flow during a forming operation of the semiconductor device of FIG. 2A.

FIG. 2A is a cross-sectional view illustrating a semiconductor device in accordance with an implementation, FIG. 2B is a graph for explaining an operating method in a case that the semiconductor device of FIG. 2A includes a variable resistance element, FIG. 2C is a graph for explaining an operating method in a case that the semiconductor device of FIG. 2A includes a threshold switching element, and FIG. 2D is a graph showing a current flow during a forming operation of the semiconductor device of FIG. 2A.

Referring to FIG. 2A, the semiconductor device of the implementation may include a first electrode 110, a second electrode 130 located over the first electrode 110 and spaced apart from the first electrode 110, and a first material layer 120 interposed between the first electrode 110 and the second electrode 130.

The first electrode 110 and the second electrode 130 may serve as applying a voltage or current to both ends of the first material layer 120, and each have a single-layered structure or multi-layered structure including one or more of various conductive materials, for example, a metal such as W, Al, Ti, etc., a metal nitride such as TiN, etc., a semiconductor material doped with an impurity, or a combination thereof.

In this implementation, the first electrode 110 may include a plurality of sub-electrodes 110A, 110C, 110E and 110G and a plurality of second material layers 110B, 110D and 110F that are alternately arranged along a direction in which the first electrode 110, the first material layer 120 and the second electrode 130 are arranged. Each of the second material layers 110B, 110D and 110F is interposed between two adjacent sub-electrodes of the sub-electrodes 110A, 110C, 110E and 110G. The sub-electrodes 110A and 110G may be positioned at both ends of the first electrode 110. In this implementation, the first electrode 110 includes four sub-electrodes 110A, 110C, 110E and 110G and three second material layers 110B, 110D and 110F. However, in other implementations, numbers of sub-electrodes and second material layers may be changed in various manners.

Each of the sub-electrodes 110A, 110C, 110E and 110G may be formed of at least one of various conductive materials, for example, a metal, a metal nitride, a semiconductor material doped with an impurity, or a combination thereof.

Each of the second material layers 110B, 110D and 110F may be formed of at least one of various insulating materials, for example, a metal oxide, a silicon oxide, a silicon nitride, or a combination thereof. Alternatively, each of the second material layers 110B, 110D and 110F may be formed of a semiconductor material which has a relatively small band gap. In an implementation, each of the second material layers 110B, 110D and 110F may have a sufficiently small thickness to enable the second material layers 110B, 110D and 110F to exhibit an ohmic-like behavior in which a current flowing therein increases in proportion to a voltage applied thereto, at an operating current of the semiconductor device. This is because a resistance value of each of the second material layers 110B, 110D and 110F is reduced regardless of a type of each of the second material layers 110B, 110D and 110F as a thickness of each of the second material layers 110B, 110D and 110F decreases. That is, each of the second material layers 110B, 110D and 110F which is thin may exhibit a leaky characteristic. In an implementation, the thickness of each of the second material layers 110B, 110D and 110F may be 3 nm or less.

A characteristic of the first electrode 110 will be described later in more detail with reference to FIGS. 3A to 3C.

In this implementation, the first electrode 110 has a stack structure in which the sub-electrodes 110A, 110C, 110E and 110G and the second material layers 110B, 110D and 110F are alternately stacked. However, in other implementations, the second electrode 130 instead of the first electrode 110 may have a stack structure in which a plurality of sub-electrodes and a plurality of second material layers are alternately stacked. Alternatively, the first and second electrodes 110 and 130 each may have a stack structure in which a plurality of sub-electrodes and a plurality of second material layers are alternately stacked.

The first material layer 120 may be substantially the same as the material layer 12 of FIG. 1A. That is, the first material layer 120 may have a variable resistance characteristic or threshold switching characteristic. A resistance value of the first material layer 120 may be also changed according to whether a conductive path CP is generated or disappears in the first material layer 120. When the first material layer 120 has the variable resistance characteristic, a current-voltage characteristic of the semiconductor device is exemplarily shown in FIG. 2B. When the first material layer 120 has the threshold switching characteristic, a current-voltage characteristic of the semiconductor device is exemplarily shown in FIG. 2C.

Referring to FIG. 2B, a current-voltage curve of the semiconductor device of the present implementation may be similar to a current-voltage curve of FIG. 1B. In FIG. 2B, the current-voltage curve of FIG. 1B is represented by a dotted line for comparison. Compared to the current-voltage curve of FIG. 1B, the current-voltage curve of the semiconductor device of the present implementation shown in FIG. 2B may be lowered to a certain degree (see downward arrows) in a voltage range between 0V and the set voltage Vset and in a voltage range between 0V and the forming voltage Vforming. This shows that a current flowing in the high resistance state HRS, that is, an off-current, is further reduced in the present implementation.

Also, referring to FIG. 2C, the current-voltage curve of the semiconductor device of the present implementation is similar to the current-voltage curve of FIG. 1C. In FIG. 2C, the current-voltage curve of FIG. 1C is represented by a dotted line for comparison. Compared to the current-voltage curve of FIG. 1C, the current-voltage curve of the semiconductor device of the present implementation shown in FIG. 2C may be lowered to a certain degree (see downward arrows) in a voltage range between 0V and the threshold voltage Vth and in a voltage range between 0V and the forming voltage Vforming. This shows that a current flowing in the high resistance state HRS, that is, an off-current, is further reduced in the present implementation.

The above reduction in the off-current of the semiconductor device of the present implementation is due to substantial reduction in an overshooting current occurring during an operation in which a resistance state of the first material layer 120 is changed into the low resistance state, for example, the forming operation and/or the set operation. The reduction in the overshooting current is because parasitic capacitance at both ends of the first material layer 120 decreases by inserting thin insulating layers or thin semiconductor layers which are a kind of resistive component in an electrode. FIG. 2D shows an overshooting current occurring during the formation operation in accordance with an implementation. The overshooting current is significantly reduced, and thus has a level similar to a compliance current CC.

Since the overshooting current decreases, a size of the conductive path CP formed in the first material layer 120 may be significantly reduced compared to the size of the conductive path CP formed in the material layer 12 of FIG. 1A. That is, a resistance value of the conductive path CP may increase. The reduction in the size of the conductive path CP causes the reduction in the off-current. As a result, operating characteristics of the semiconductor device such as a leakage current, a data read margin, and the like may be improved. Also, the reduction in the overshooting current may reduce a physical defect of the first material layer 120, thereby improving reliability of a switching operation of the semiconductor device, for example, an endurance characteristic and a retention characteristic. Furthermore, when the second material layers 110B, 110D and 110F are formed of a material having low thermal conductivity such as $HfO_2$, a thermal isolation effect increases. Therefore, an operating power of the semiconductor device may be reduced.

Hereinafter, a first electrode having a stack structure in which a plurality of sub-electrodes and a plurality of second material layers are alternately stacked will be described in more detail with reference to FIGS. 3A to 3C.

Figure 3A:
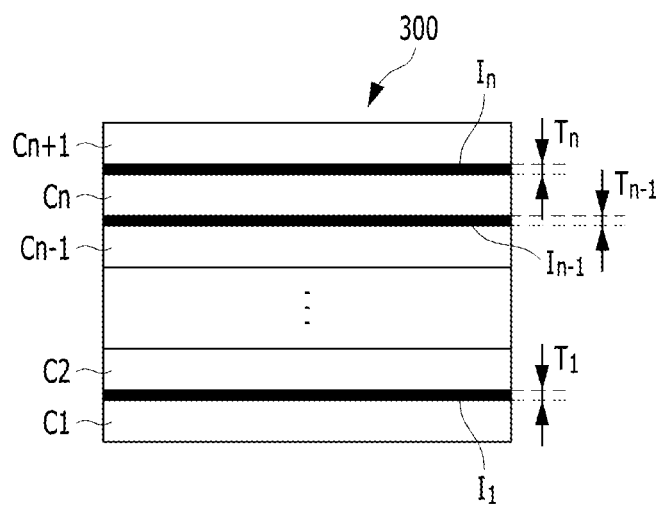
FIG. 3A is a cross-sectional view illustrating a first electrode in accordance with an implementation.
Figure 3B:
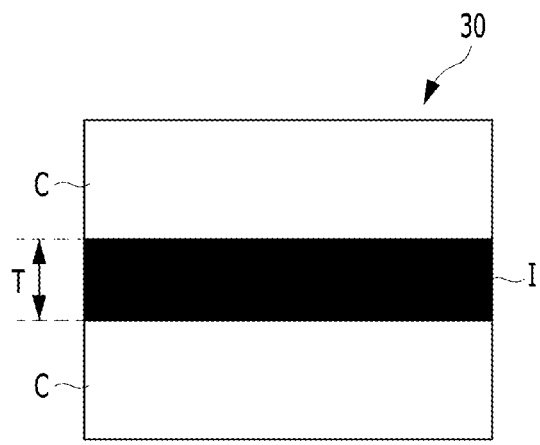
FIG. 3B is a cross-sectional view illustrating a first electrode in accordance with another comparative example.
Figure 3C:
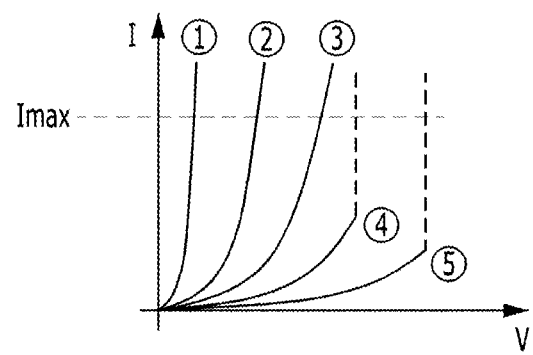
FIG. 3C is a graph showing current-voltage characteristics of the first electrodes of FIGS. 3A and 3B.

FIG. 3A is a cross-sectional view illustrating a first electrode in accordance with an implementation, FIG. 3B is a cross-sectional view illustrating a first electrode in accordance with another comparative example, and FIG. 3C is a graph showing current-voltage characteristics of the first electrodes of FIGS. 3A and 3B.

Referring to FIG. 3A, a first electrode 300 may include a plurality of sub-electrodes C1, C2, ..., Cn−1, Cn and Cn+1 and a plurality of second material layers I1, ..., In−1 and In that are alternately stacked, where n is a natural number of 2 or more. Since two sub-electrodes C1 and Cn+1 are located at both ends of the first electrode 300, the number of the sub-electrodes C1, C2, ..., Cn−1, Cn and Cn+1 may be one in excess of the number of the second material layers I1, ..., In−1 and In.

Each of the sub-electrodes C1, C2, ..., Cn−1, Cn and Cn+1 may be formed of a conductive material. The sub-electrodes C1, C2, ..., Cn−1, Cn and Cn+1 may have substantially the same thicknesses. The sub-electrodes C1, C2, ... Cn−1, Cn and Cn+1 may include substantially the same materials.

Each of the second material layers I1, ..., In−1 and In may be formed of an insulating material or a semiconductor material. The second material layers I1, ..., In−1 and In may have substantially the same thicknesses. The second material layers I1, ..., In−1 and In may include substantially the same materials.

In an implementation, each of the second material layers I1, ..., In−1 and In may have a sufficiently small thickness to enable the second material layers I1, ..., In−1 and In to exhibit an ohmic-like behavior in which a current flowing therein increases in proportion to a voltage applied to the first electrode 300, at an operating current of the semiconductor device including the first electrode 300. That is, each of the second material layers I1, ... In−1 and In may not be broken down at the operating current. Each of the second material layers I1, ..., In−1 and In may cause its breakdown when each of the second material layers I1, ..., In−1 and In is thick.

Referring to FIG. 3B, a first electrode 30 of the comparative example may include two sub-electrodes C and one second material layer I interposed therebetween.

Referring to FIG. 3C, a curve ① shows a current-voltage characteristic of the first electrode 30 when a thickness T of the second material layer I of the first electrode 30 is substantially the same as one of thicknesses T1, ..., Tn−1 and Tn of the second material layers I1, ..., In−1 and In of the first electrode 300 of FIG. 3A.

A curve ② shows a current-voltage characteristic of the first electrode 300 when the number of the second material layers I1, ..., In−1 and In of the first electrode 300 is two, that is, when the first electrode 300 includes the sub-electrodes C1, C2 and C3 and the second material layers I1 and I2 that are alternately stacked.

A curve ③ shows a current-voltage characteristic of the first electrode 300 when the number of the second material layers I1, ..., In−1 and In of the first electrode 300 is three, that is, when the first electrode 300 includes the sub-electrodes C1, C2, C3 and C4 and the second material layers I1, I2 and I3 that are alternately stacked.

A curve ④ shows a current-voltage characteristic of the first electrode 30 when a thickness T of the second material layer I of the first electrode 30 is substantially the same as the sum of thicknesses T1 and T2 of the second material layers I1 and I2 of the first electrode 300.

A curve ⑤ shows a current-voltage characteristic of the first electrode 30 when a thickness T of the second material layer I of the first electrode 30 is substantially the same as the sum of thicknesses T1, T2 and T3 of the second material layers I1, I2 and I3 of the first electrode 300.

When a maximum current which can flow in the semiconductor device is referred to as Imax, referring to the curve ①, the first electrode 30 including one second material layer I, which is thin, shows an ohmic-like behavior at the maximum current Imax or less, that is, at an operating current of the semiconductor device. However, in this case, the current increases sharply according to a voltage applied to the first electrode 30, and thus a very high current flows at a very low voltage. This means that there is a limit to the reduction in an off-current of the semiconductor device when the first electrode 30 includes a single thin insulating layer or a single thin semiconductor layer.

Referring to the curve ② when the first electrode 300 includes two second material layers I1 and I2, which are thin, a degree of increase in a current may be reduced compared to the curve ①. Furthermore, referring to the curve ③, a degree of increase in a current may be further reduced when the first electrode 300 includes three second material layers I1, I2 and I3. That is, a degree of increase in a current decreases as the number of the second material layers I1, ..., In−1 and In increases. As a result, an off-current of the semiconductor device decreases as the number of the second material layers I1, ..., In−1 and In increases.

Meanwhile, referring to the curve ④, the first electrode 30 may be broken down at the operating current when the first electrode 30 includes one second material layer I having the thickness T which is substantially the same as the sum of the thicknesses T1 and T2 of the second material layer I1 and I2 of the first electrode 300. Furthermore, referring to the curve ⑤, the first electrode 30 may be broken down more easily at the operating current when the first electrode 30 includes one second material layer I having the thickness T which is substantially the same as the sum of the thicknesses T1, T2 and T3 of the second material layer I1, I2 and I3 of the first electrode 300. That is, it is difficult to reduce the off-current since an increase in the thickness T of the second material layer I causes a breakdown. Furthermore, there is a problem that an on-current at a certain breakdown voltage decreases as the breakdown voltage increases.

To sum up, when using a stack structure in which two or more thin insulating layers (or two or more thin semiconductor layers) and conductive layers are alternately stacked as an electrode, the off-current may decrease and the on-current may increase compared to a case that an electrode including a single thin insulating layer or a single thick insulating layer is used. As a result, an operating characteristic and reliability of the semiconductor device may be improved.

Meanwhile, as already mentioned, the first material layer 120 may have a multi-layered structure. This will be exemplarily described with reference to FIG. 4.

Figure 4:
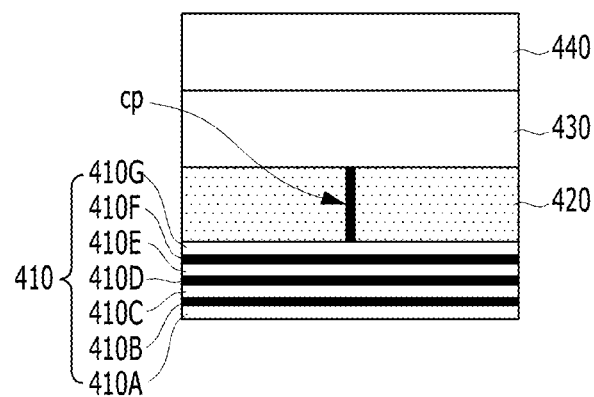
FIG. 4 is a cross-sectional view illustrating a semiconductor device in accordance with another implementation.

FIG. 4 is a cross-sectional view illustrating a semiconductor device in accordance with another implementation.

First, a case that the semiconductor device of FIG. 4 includes a threshold switching element that includes a threshold switching material and is interposed between two electrodes will be described.

Referring to FIG. 4, the semiconductor device may include a first electrode 410, a threshold switching element, and a second electrode 440.

In this implementation, the threshold switching element may have a double-layered structure in which a first layer 420 and a second layer 430 are stacked, and may show a threshold switching characteristic by a combination of the first layer 420 and the second layer 430. Alternatively, the first layer 420 and the second layer 430 each may show the threshold switching characteristic. For example, the first layer 420 may be a tunneling insulating layer, and the second layer 430 may be one of an OTS material layer, an MIEC material layer and an MIT material layer. In this implementation, when a certain positive voltage is applied to the first electrode 410 and a certain negative voltage is applied to the second electrode 440, a conductive path CP may be formed in the first layer 420 by tunneling of electrons. Therefore, the threshold switching element may be switched to be in an on-state. On the other hand, when a certain negative voltage is applied to the first electrode 410 and a certain positive voltage is applied to the second electrode 440, the conductive path CP which has been generated in the first layer 420 may disappear because the electrons move in a reverse direction. Therefore, the threshold switching element may be switched to be in an off-state.

In this implementation, the first electrode 410 may include a plurality of sub-electrodes 410A, 410C, 410E and 410G and a plurality of second material layers 410B, 410D and 410F that are alternately stacked. Each of the second material layers 410B, 410D and 410F may include a thin insulating material layer or a thin semiconductor material layer. The thin insulating material layer or the thin semiconductor material layer may have a sufficiently small thickness that enables the thin insulating material layer or the thin semiconductor material layer to exhibit an ohmic-like behavior and is not broken down at an operating current of the semiconductor device of this implementation. Due to this first electrode 410, a conductive path CP, which is formed by tunneling of electrons and has a small size, may be generated in the threshold switching element. Specially, the conductive path CP may be generated in the first layer 420 that is adjacent to the first electrode 410 and serves as a tunneling insulating layer. As a result, an off-current of the threshold switching element may be reduced.

Next, a case that the semiconductor device of FIG. 4 includes a variable resistance element that includes a variable resistance material and is interposed between two electrodes will be described.

Referring again to FIG. 4, the semiconductor device may include a first electrode 410, a variable resistance element, and a second electrode 440.

In this implementation, the variable resistance element may have a double-layered structure in which a first layer 420 and a second layer 430 are stacked, and may show a variable resistance characteristic by a combination of the first layer 420 and the second layer 430. Alternatively, the first layer 420 and the second layer 430 each may show the variable resistance characteristic. In an implementation, the second layer 430 may include an oxygen-deficient metal oxide layer containing a large amount of oxygen vacancies, and the first layer 420 may include an oxygen-rich metal oxide layer containing a large amount of oxygen compared to the second layer 430. The oxygen-deficient metal oxide layer may be formed of a material that is deficient in oxygen compared to a material that satisfies a stoichiometric ratio. For example, the oxygen-deficient metal oxide layer may include $TiO_x$, where x is smaller than 2, $TaO_y$, where y is smaller than 2.5, or $HfO_z$, where z is smaller than 2. The oxygen-rich metal oxide layer may be formed of a material that satisfies a stoichiometric ratio. For example, the oxygen-rich metal oxide layer may include one or more of $TiO_2$, $Ta_2O_5$, $HfO_2$, etc. In this implementation, when a certain negative voltage is applied to the first electrode 410 and a certain positive voltage is applied to the second electrode 440, a conductive path CP may be formed in the oxygen-rich metal oxide layer because the oxygen vacancies of the oxygen-deficient metal oxide layer is injected into the oxygen-rich metal oxide layer. Therefore, the variable resistance element may be switched to be in a low resistance state. On the other hand, when a certain positive voltage is applied to the first electrode 410 and a certain negative voltage is applied to the second electrode 440, the conductive path CP, which has been generated, may disappear because the oxygen vacancies move toward the oxygen-deficient metal oxide layer. Therefore, the variable resistance element may be switched to be in a high resistance state.

As described above, the first electrode 410 may include the plurality of sub-electrodes 410A, 410C, 410E and 410G and the plurality of second material layers 410B, 410D and 410F that are alternately stacked. Each of the second material layers 410B, 410D and 410F may be thin. Therefore, a conductive path CP, which is formed by oxygen vacancies and has a small size, may be generated in the variable resistance element. Specially, the conductive path CP may be generated in the first layer 420 that is adjacent to the first electrode 410 and formed of an oxygen-rich metal oxide. As a result, an off-current of the variable resistance element may be reduced.

Meanwhile, as already mentioned, a variable resistance element and a threshold switching element which are coupled to each other may be used as a memory cell. This will be exemplarily described with reference to FIG. 5.

Figure 5:
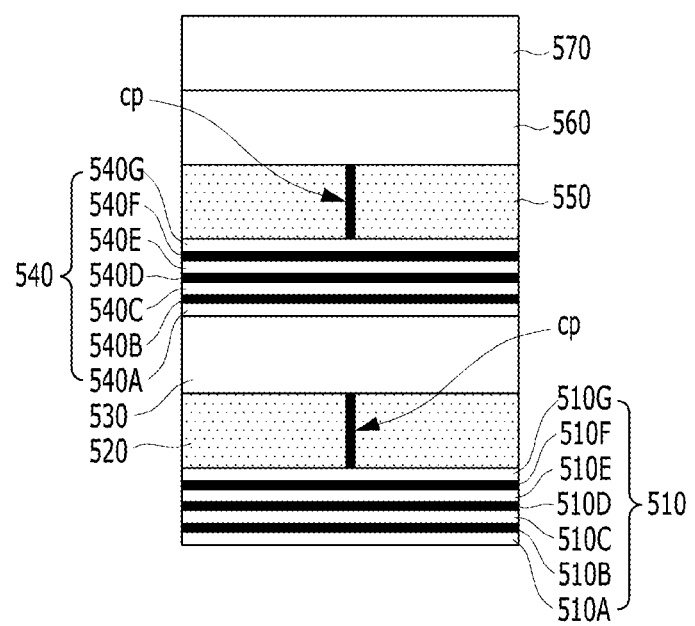
FIG. 5 is a cross-sectional view illustrating a semiconductor device in accordance with still another implementation.

FIG. 5 is a cross-sectional view illustrating a semiconductor device in accordance with still another implementation. The semiconductor device may include a structure in which a variable resistance element and a threshold switching element are serially coupled to each other and serve as a memory cell for storing data.

Referring to FIG. 5, the memory cell may include first to third electrodes 510, 540 and 570, which are arranged in a direction, for example, in a stacking direction, to be spaced apart from each other. The memory cell may further include a variable resistance element interposed between the first electrode 510 and the second electrode 540, and a threshold switching element interposed between the second electrode 540 and the third electrode 570.

The variable resistance element may have a double-layered structure in which a first layer 520 and a second layer 530 are stacked, and may show a variable resistance characteristic by a combination of the first layer 520 and the second layer 530. Alternatively, the first layer 520 and the second layer 530 each may show the variable resistance characteristic. In an implementation, the second layer 530 may include an oxygen-deficient metal oxide layer containing a large amount of oxygen vacancies, and the first layer 520 may include an oxygen-rich metal oxide layer containing a large amount of oxygen compared to the second layer 530. A conductive path CP may be generated in the first layer 520 which is the oxygen-rich metal oxide layer.

The threshold switching element may have a double-layered structure in which a first layer 550 and a second layer 560 are stacked, and may show a threshold switching characteristic by a combination of the first layer 550 and the second layer 560. Alternatively, the first layer 550 and the second layer 560 each may show the threshold switching characteristic. In an implementation, the first layer 550 may be a tunneling insulating layer, and the second layer 560 may be a threshold switching material layer which is different from the tunneling insulating layer. A conductive path CP may be generated in the first layer 550 which is the tunneling insulating layer.

The first electrode 510 may include a plurality of sub-electrodes 510A, 510C, 510E and 510G and a plurality of second material layers 510B, 510D and 510F that are alternately stacked. Each of the second material layers 510B, 510D and 510F may be thin. Therefore, a size of the conductive path CP generated in the variable resistance element may be reduced.

Also, the second electrode 540 may include a plurality of sub-electrodes 540A, 540C, 540E and 540G and a plurality of second material layers 540B, 540D and 540F that are alternately stacked. Each of the second material layers 540B, 540D and 540F may be thin. Therefore, a size of a conductive path CP generated in the threshold switching element may be reduced.

As a result, the memory cell of FIG. 5 may have a reduced off-current and an increased data read margin.

In the present implementation, the first electrode 510 and the second electrode 540 each have a stack structure in which sub-electrodes and thin insulating layers (or thin semiconductor layers) are alternately stacked. However, in other implementations, at least one of the first to third electrodes 510, 540 and 570 may have a stack structure in which sub-electrodes and thin insulating layers (or thin semiconductor layers) are alternately stacked. Alternatively, the second electrode 540 may be omitted, and thus the variable resistance element may be in a direct contact with the threshold switching element.

Figure 6:
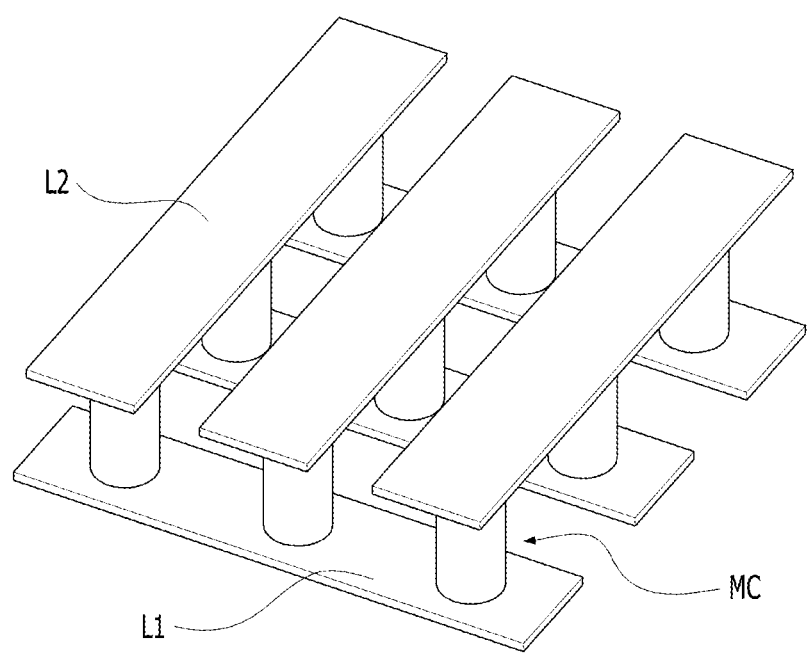
FIG. 6 is a perspective view illustrating a memory cell array in accordance with an implementation.

Since the above-described semiconductor devices have a low off-current characteristic, it is easy to implement a cross-point cell array of FIG. 6.

FIG. 6 is a perspective view for explaining a memory cell array in accordance with an implementation.

Referring to FIG. 6, the memory cell array of the present implementation may have a cross-point structure which includes a plurality of first lines L1 extending in a first direction, a plurality of second lines L2 disposed over the first lines L1 and extending in a second direction crossing the first direction, and a plurality of memory cells MC disposed between the first lines L1 and the second lines L2 and disposed at intersections of the first lines L1 and the second lines L2, respectively.

Here, each of the memory cells MC may include one of the structures shown in FIGS. 2A, 4 and 5.

The above and other memory circuits or semiconductor devices based on the disclosed technology can be used in a range of devices or systems. FIGS. 7-11 provide some examples of devices or systems that can implement a memory circuit in accordance with an embodiment disclosed herein.

Figure 7:
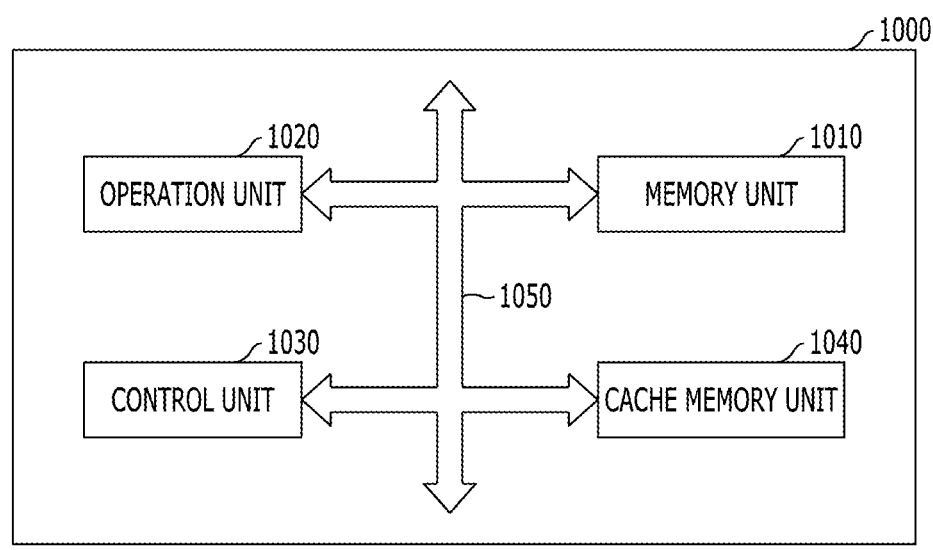
FIG. 7 illustrates a microprocessor implementing memory circuitry based on the disclosed technology.

FIG. 7 illustrates a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the memory unit 1010 may be improved. As a consequence, operating characteristic and a reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
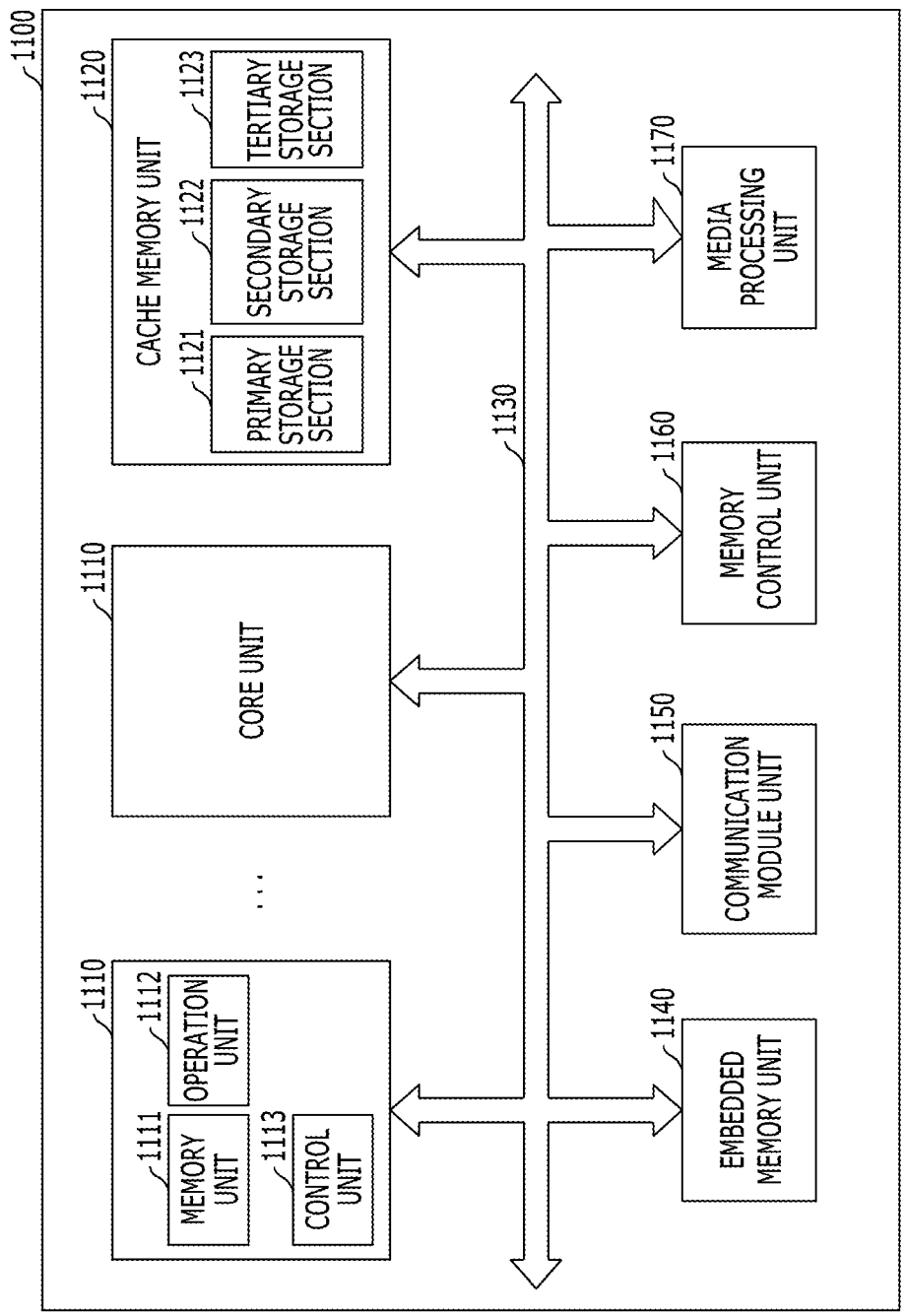
FIG. 8 illustrates a processor implementing memory circuitry based on the disclosed technology.

FIG. 8 illustrates a processor implementing memory circuitry based on the disclosed technology.

Referring to FIG. 8, a processor 1100 may improve performance and realize mufti-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the cache memory unit 1120 may be improved. As a consequence, an operating characteristic and a reliability of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
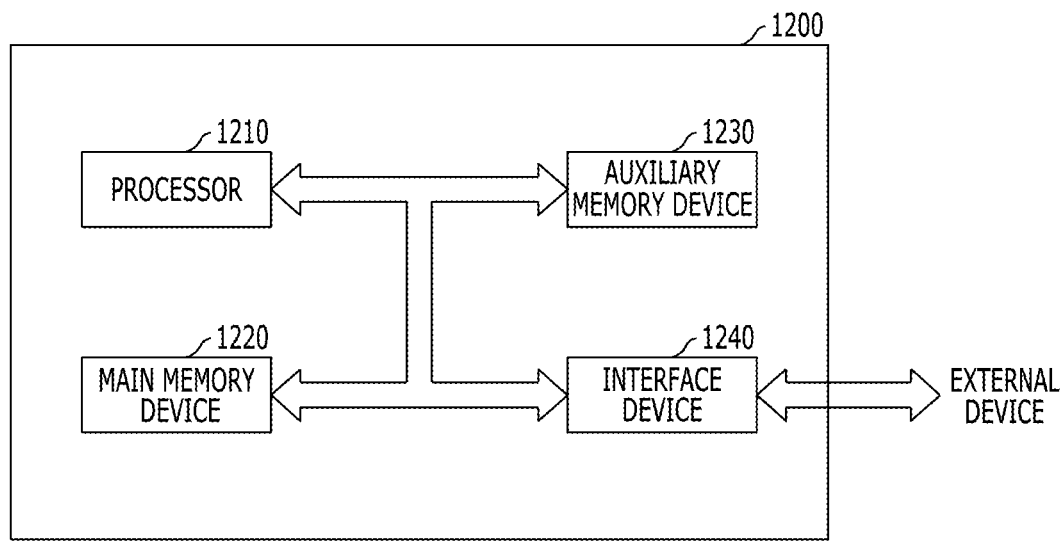
FIG. 9 illustrates a system implementing memory circuitry based on the disclosed technology.

FIG. 9 illustrates a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the main memory device 1220 may be improved. As a consequence, an operating characteristic and a reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the auxiliary memory device 1230 may be improved. As a consequence, an operating characteristic and a reliability of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
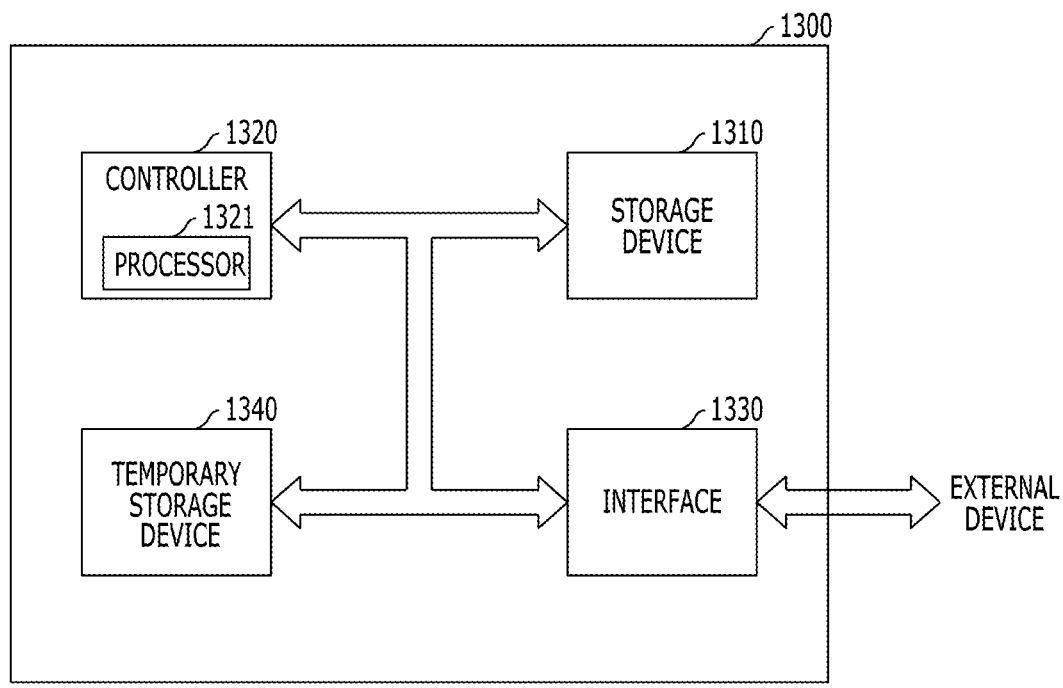
FIG. 10 illustrates a data storage system implementing memory circuitry based on the disclosed technology.

FIG. 10 illustrates a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the temporary storage device 1340 may be improved. As a consequence, an operating characteristic and a reliability of the data storage system 1300 may be reduced.

Figure 11:
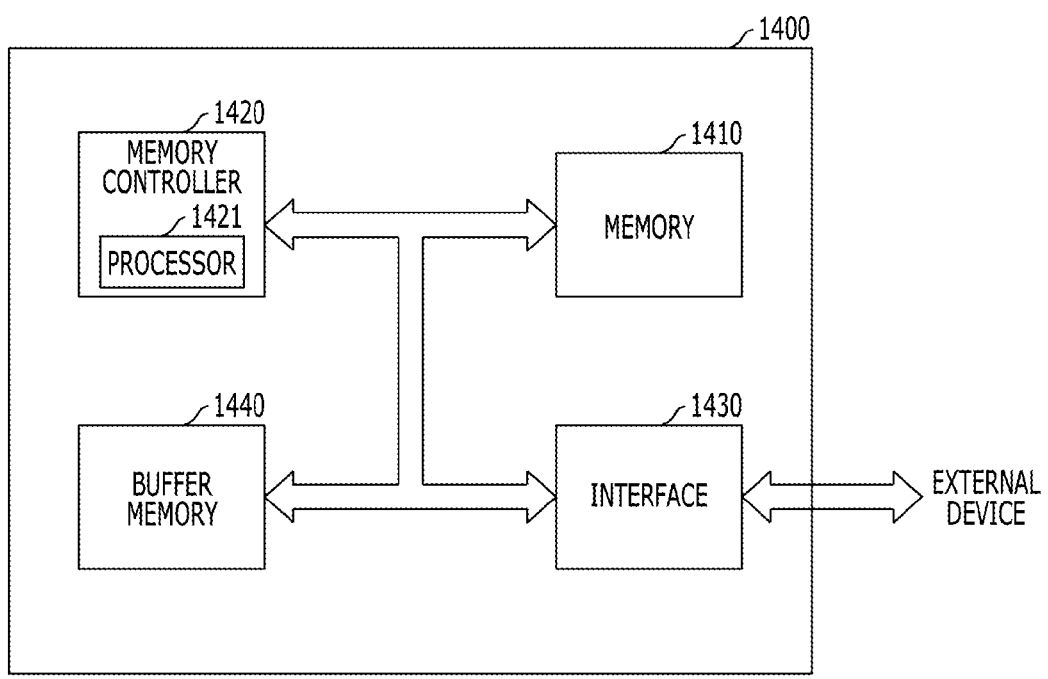
FIG. 11 illustrates a memory system implementing memory circuitry based on the disclosed technology.

FIG. 11 illustrates a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the memory 1410 may be improved. As a consequence, an operating characteristic and a reliability of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include a first electrode and a second electrode which are arranged to be spaced apart from each other in a first direction; and a first material layer which is interposed between the first electrode and the second electrode and has a variable resistance characteristic or a threshold switching characteristic, wherein at least one of the first electrode and the second electrode includes a plurality of sub electrodes and a plurality of second material layers which are alternately arranged in the first direction, and each of the second material layers has a thickness showing an ohmic-like behavior in an operating current. Through this, an operating characteristic and a reliability of the buffer memory 1440 may be improved. As a consequence, an operating characteristic and a reliability of the memory system 1400 may be reduced.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiments and examples are described. Other embodiments, enhancements and variations can be made based on what is described and illustrated in this disclosure.

What is claimed is:

1. An electronic device comprising a semiconductor memory unit including a plurality of memory cells, each of the plurality of memory cells comprising:
    a first electrode and a second electrode spaced apart from each other in a first direction;
    a variable resistance element interposed between the first electrode and the second electrode; and
    a threshold switching element interposed between the variable resistance element and the second electrode,
    wherein the first electrode, or the second electrode, or both includes a plurality of sub-electrodes and a plurality of material layers that are alternately arranged in the first direction, and
    wherein each of the material layers has a thickness that is sufficiently small to enable the material layers to exhibit an ohmic-like behavior for a current flowing therein at an operating current of the memory cell.

2. The electronic device according to claim 1, wherein each of the plurality of memory cells further comprises:
    a third electrode interposed between the variable resistance element and the threshold switching element.

3. The electronic device according to claim 2, wherein the third electrode includes the plurality of sub-electrodes and the plurality of material layers that are alternately arranged in the first direction.

4. The electronic device according to claim 1, wherein each of the plurality of material layers includes an insulating material or a semiconductor material.

5. The electronic device according to claim 1, wherein the semiconductor memory unit further comprises:
    first lines extending in a second direction crossing the first direction; and
    second lines extending in a third direction crossing the first and second directions,
    wherein the first lines are spaced apart from the second lines in the first direction, and
    wherein the plurality of memory cells are located at intersections of the first lines and the second lines, respectively.

6. The electronic device according to claim 1, wherein each of the plurality of material layers is not broken down at the operating current.

7. The electronic device according to claim 1, wherein the plurality of material layers have the same thicknesses.

8. The electronic device according to claim 1, wherein the plurality of material layers include the same materials.

9. The electronic device according to claim 1, wherein the first electrode includes the plurality of sub-electrodes and the plurality of material layers, and two sub-electrodes of the plurality of sub-electrodes are positioned at both ends of the first electrode in the first direction, respectively.

10. The electronic device according to claim 1, wherein the variable resistance element has a resistance value that changes according to whether a conductive path is generated or disappears in the variable resistance element.

11. The electronic device according to claim 1, wherein the variable resistance element has a single-layered structure or multi-layered structure including a metal oxide, a phase-change material, a ferroelectric material, a ferromagnetic material, or a combination thereof.

12. The electronic device according to claim 1, wherein the threshold switching element has a single-layered structure or multi-layered structure including a diode, an OTS (Ovonic Threshold Switching) material, an MIEC (Mixed Ionic Electronic Conducting) material, an MIT (Metal Insulator Transition) material, a tunneling insulating material, or a combination thereof.

13. The electronic device according to claim 1, wherein the variable resistance element includes a stack structure in which an oxygen-deficient metal oxide layer and an oxygen-rich metal oxide layer are arranged in the first direction.

14. The electronic device according to claim 13, wherein the first electrode includes the plurality of sub-electrodes and the plurality of material layers, and the oxygen-rich metal oxide layer is adjacent to the first electrode.

15. The electronic device according to claim 1, wherein the threshold switching element includes a plurality of layers which are arranged in the first direction, and
wherein at least one of the plurality of layers is a tunneling insulating layer.

16. The electronic device according to claim 15, wherein the first electrode includes the plurality of sub-electrodes and the plurality of material layers, and the tunneling insulating layer is adjacent to the first electrode.

17. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit is a part of the memory unit in the microprocessor.

18. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit is a part of the cache memory unit in the processor.

19. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit is a part of the auxiliary memory device or the main memory device in the processing system.

20. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is a part of the storage device or the temporary storage device in the data storage system.

* * * * *